United States Patent
Wang et al.

(10) Patent No.: US 11,839,160 B2
(45) Date of Patent: Dec. 5, 2023

(54) WAFER-LEVEL MANUFACTURING PROCESS OF A FLEXIBLE INTEGRATED ARRAY SENSOR

(71) Applicant: United Microelectronics Center Co., Ltd, Chongqing (CN)

(72) Inventors: Miao Wang, Chongqing (CN); Weimong Tsang, Chongqing (CN); Wenlong Jiao, Chongqing (CN); Haopeng Wang, Chongqing (CN); Ruifeng Yang, Chongqing (CN)

(73) Assignee: United Microelectronics Center Co., Ltd, Chongqing (CN)

( * ) Notice: Subject to any disclaimer, the term of this patent is extended or adjusted under 35 U.S.C. 154(b) by 198 days.

(21) Appl. No.: 17/111,529

(22) Filed: Dec. 4, 2020

(65) Prior Publication Data

US 2021/0175283 A1    Jun. 10, 2021

(51) Int. Cl.
| | | |
|---|---|---|
| *H10N 39/00* | (2023.01) | |
| *G01L 1/16* | (2006.01) | |
| *H01L 21/78* | (2006.01) | |
| *H01L 25/065* | (2023.01) | |

(52) U.S. Cl.
CPC ............. *H10N 39/00* (2023.02); *G01L 1/16* (2013.01); *H01L 21/78* (2013.01); *H01L 25/0655* (2013.01)

(58) Field of Classification Search
CPC ....... G01L 1/16; H01L 21/78; H01L 25/0655; H10N 39/00
See application file for complete search history.

(56) References Cited

U.S. PATENT DOCUMENTS

| | | | | |
|---|---|---|---|---|
| 7,290,323 | B2 * | 11/2007 | Deconde ............ | G06V 40/1306 29/595 |
| 10,155,656 | B2 * | 12/2018 | Cheng .................. | B81B 7/0006 |
| 2003/0015646 | A1 * | 1/2003 | Deconde ............ | G06V 40/1306 250/208.1 |
| 2005/0210988 | A1 * | 9/2005 | Amano ................. | H10N 39/00 438/52 |
| 2007/0152537 | A1 * | 7/2007 | Yamaguchi ............ | G01L 17/00 310/311 |
| 2014/0232241 | A1 * | 8/2014 | Hajati ................. | G01N 29/262 310/317 |

(Continued)

FOREIGN PATENT DOCUMENTS

CN         112002717 A  * 11/2020   ....... H01L 27/14603

*Primary Examiner* — Peter Dungba Vo
*Assistant Examiner* — Jose K Abraham

(57) ABSTRACT

The present disclosure provides a flexible integrated array sensor and manufacturing methods thereof. The array sensor includes a silicon wafer, a readout circuit layer, a sensing array layer, and a polymer substrate layer disposed on the silicon wafer. The manufacturing method includes: preparing a silicon wafer; fabricating a plurality of function arrays, each including m*n function units, on a surface of the silicon wafer; etching one or more deep grooves on the surface of the silicon wafer between the arrays; fabricating a thinning support; and thinning a bottom surface of the silicon wafer to a target thickness so that the arrays are separated from each other. The etching depth for etching the one or more deep grooves is equal to or greater than the thickness of the silicon wafer after thinning.

4 Claims, 14 Drawing Sheets

(56) References Cited

U.S. PATENT DOCUMENTS

| | | | | |
|---|---|---|---|---|
| 2014/0368230 A1* | 12/2014 | Tsurume | ............ | G01R 31/2607 |
| | | | | 324/762.01 |
| 2015/0357375 A1* | 12/2015 | Tsai | .................... | H10N 30/302 |
| | | | | 257/416 |
| 2016/0107194 A1* | 4/2016 | Panchawagh | ......... | B06B 1/0666 |
| | | | | 310/317 |
| 2018/0151435 A1* | 5/2018 | Chiang | ............... | H01L 23/3171 |
| 2018/0207681 A1* | 7/2018 | Chau | .................... | H10N 39/00 |
| 2019/0033252 A1* | 1/2019 | Huang | ............... | G01N 27/4145 |

\* cited by examiner

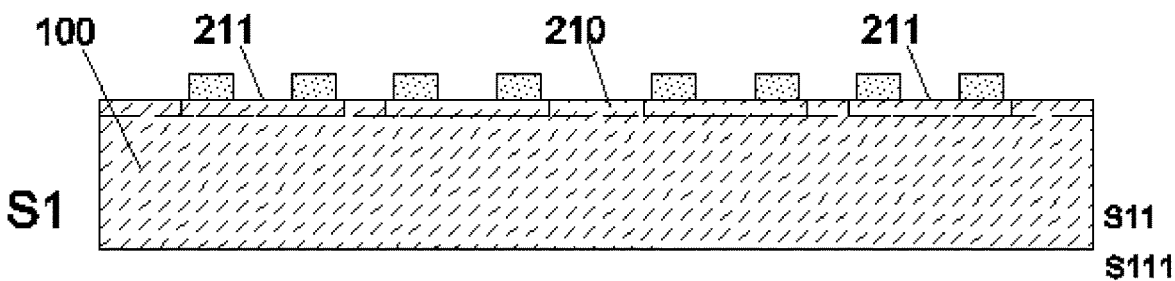
Fig. 3.1a
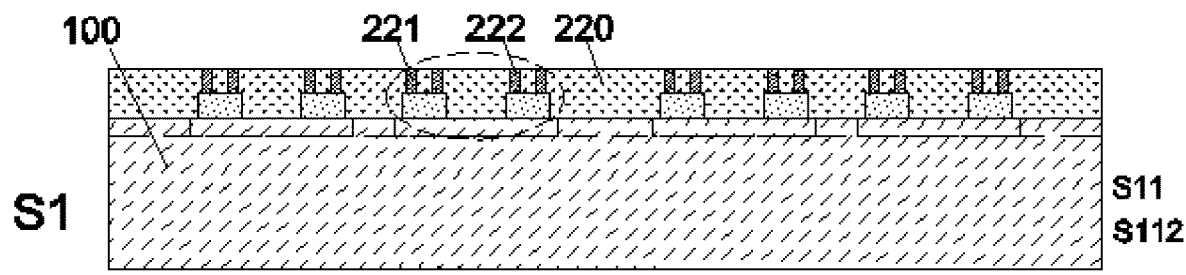
Fig. 3.1b
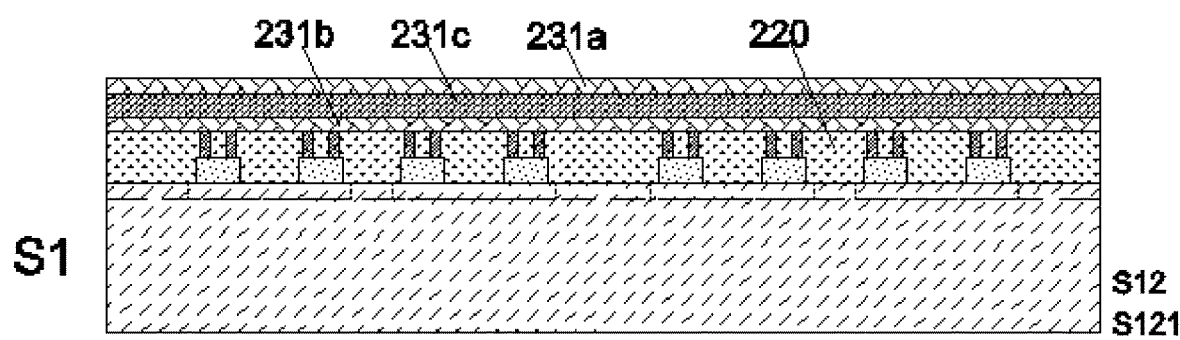
Fig. 3.1c
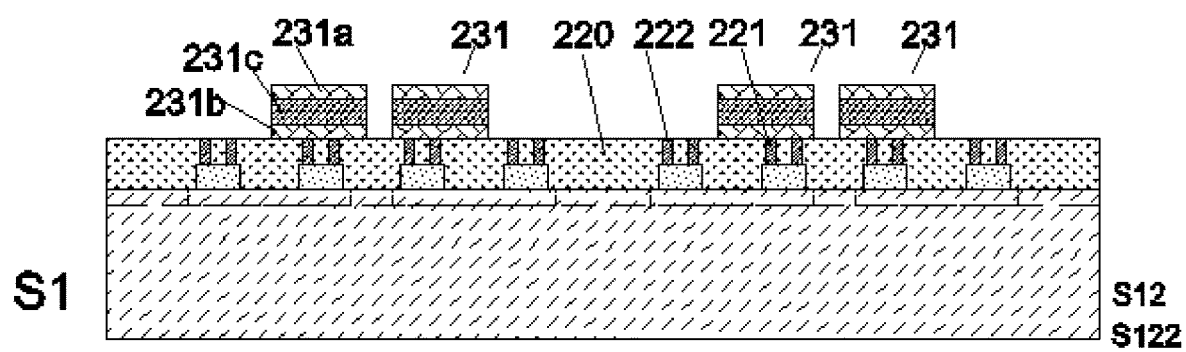
Fig. 3.1d

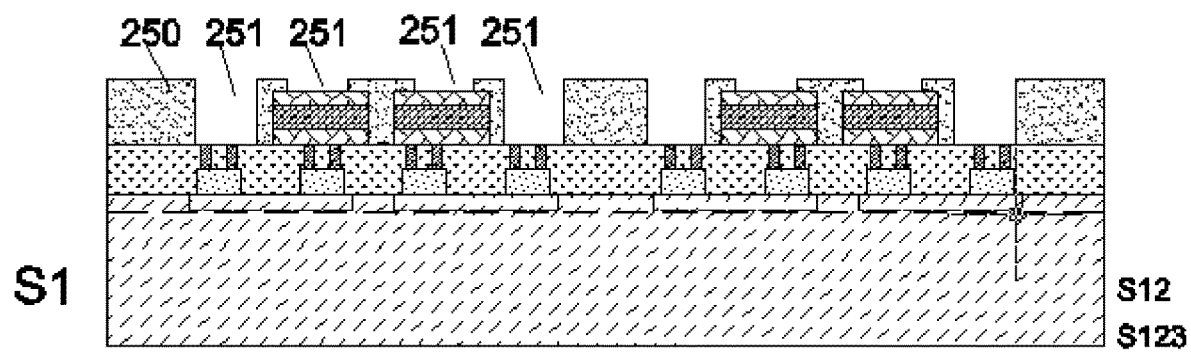
Fig. 3.1e
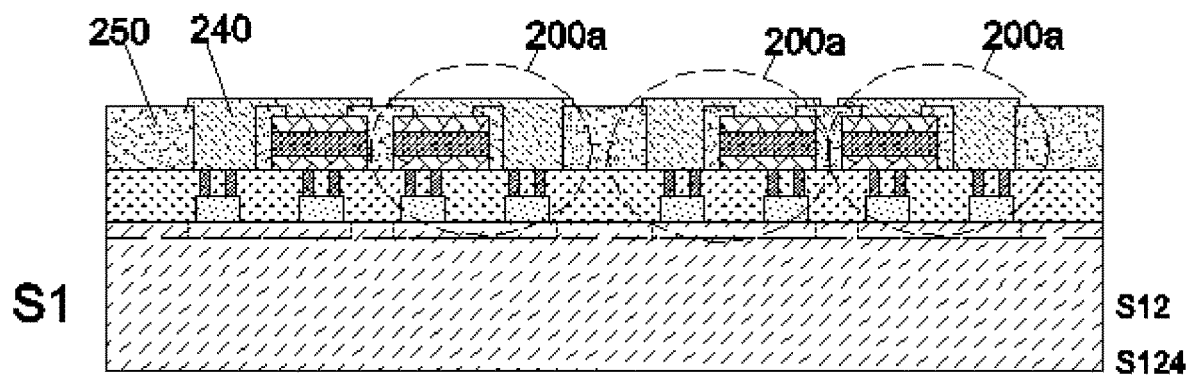
Fig. 3.1f

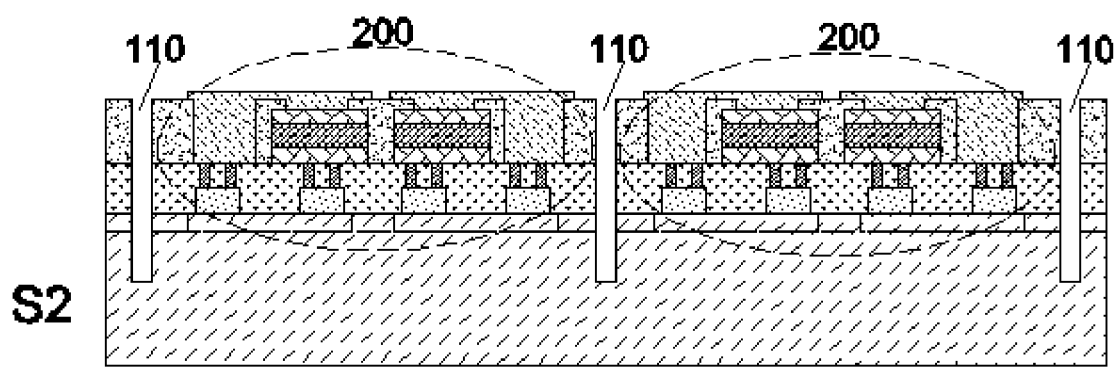
Fig. 3.2

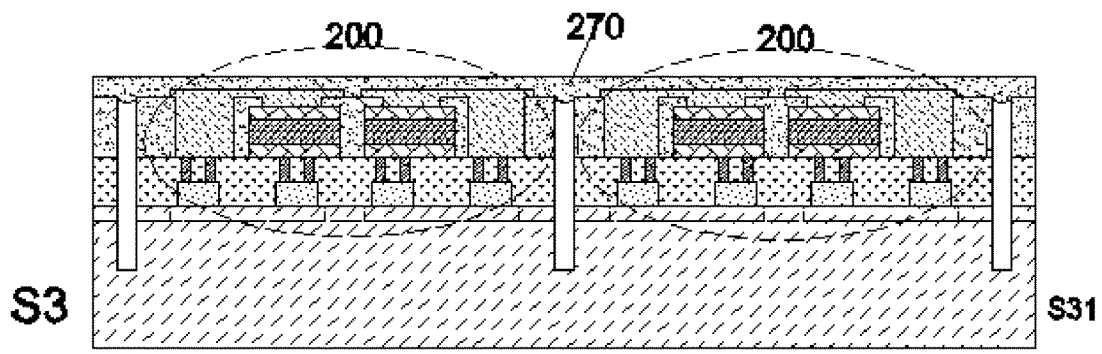
Fig. 3.3a
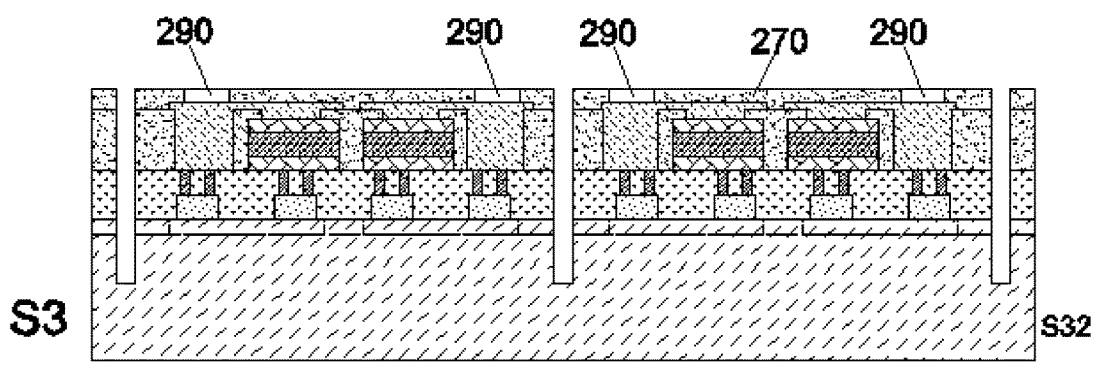
Fig. 3.3b
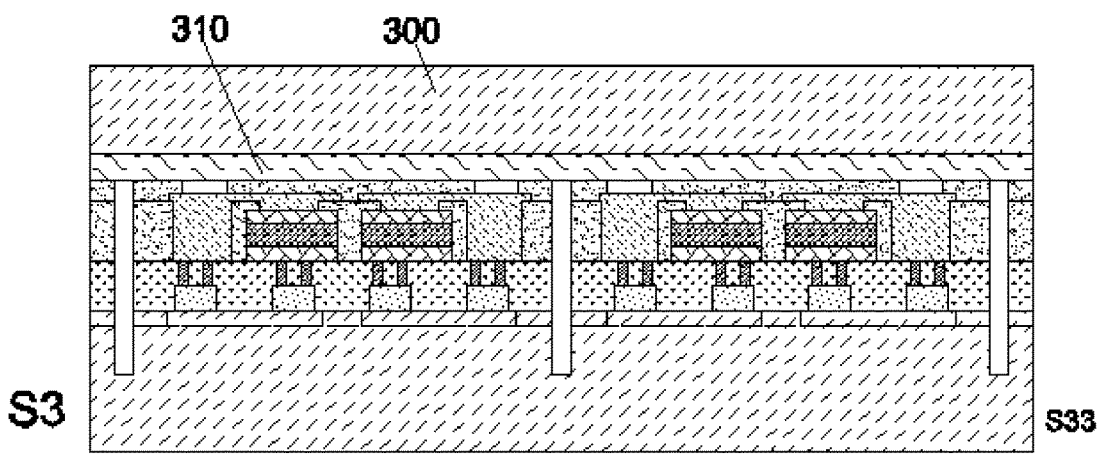
Fig. 3.3c
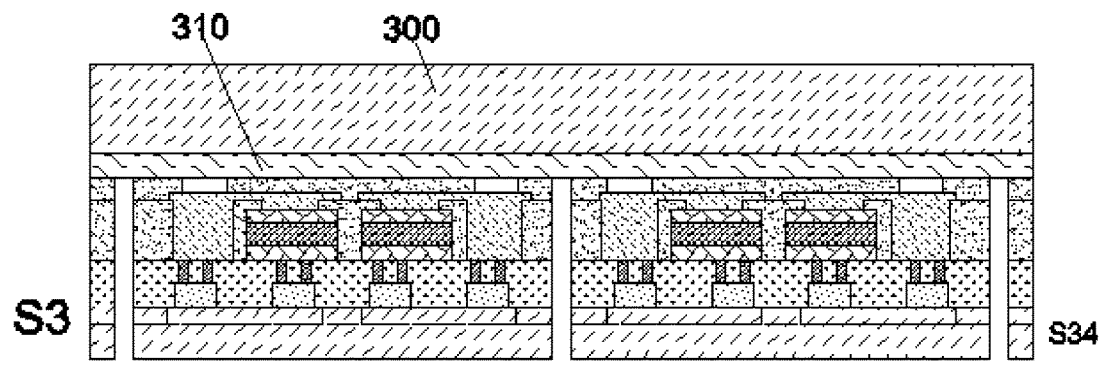
Fig. 3.3d

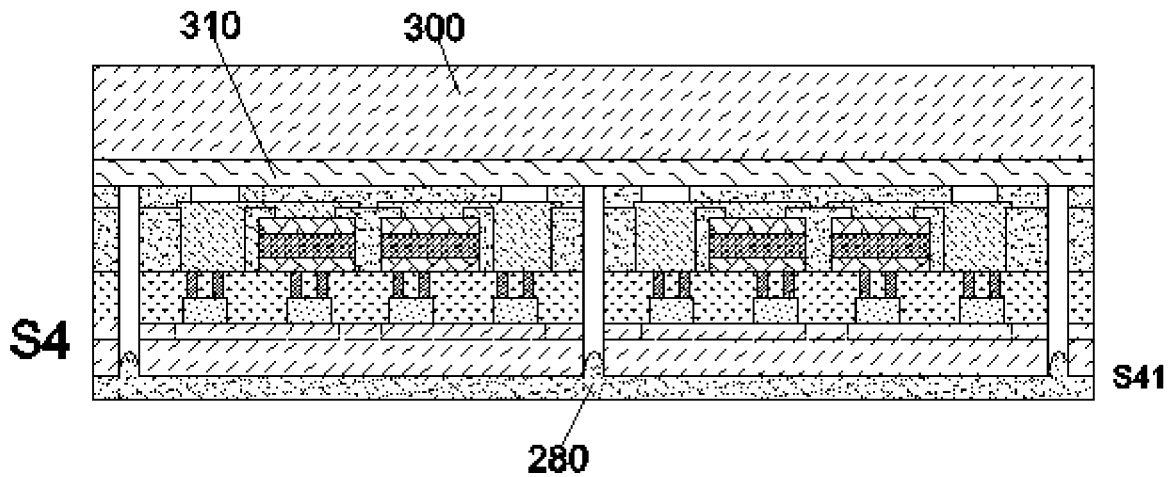
Fig. 3.4a
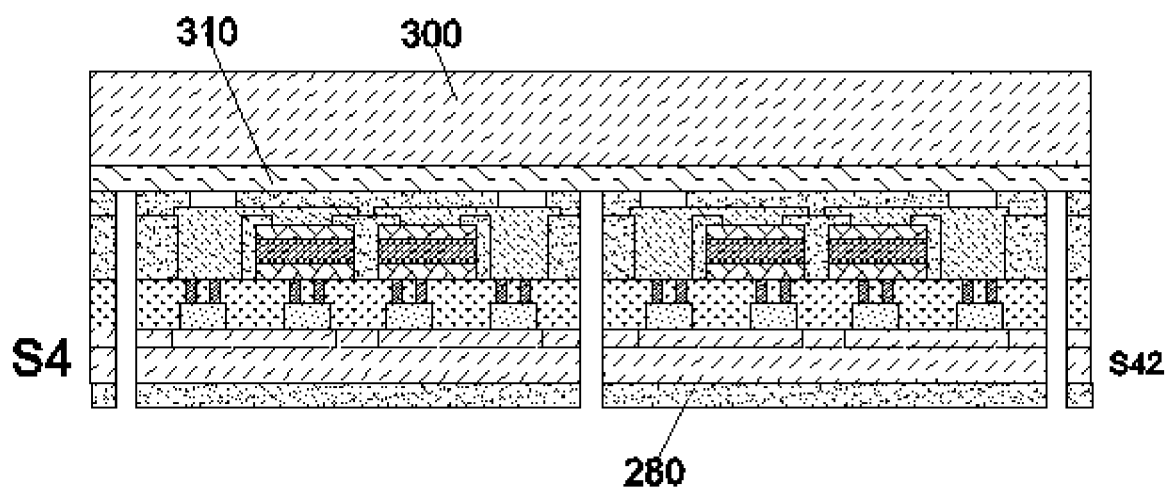
Fig. 3.4b
Fig. 3.4c

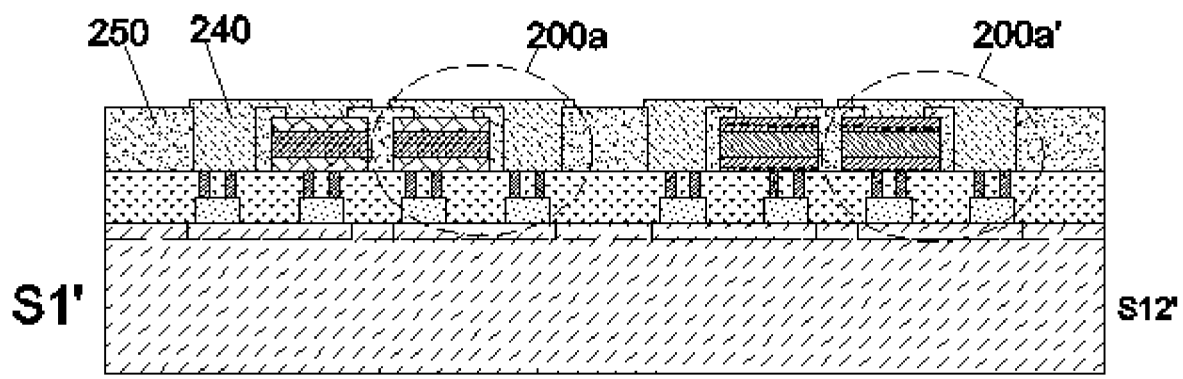
Fig. 6.1
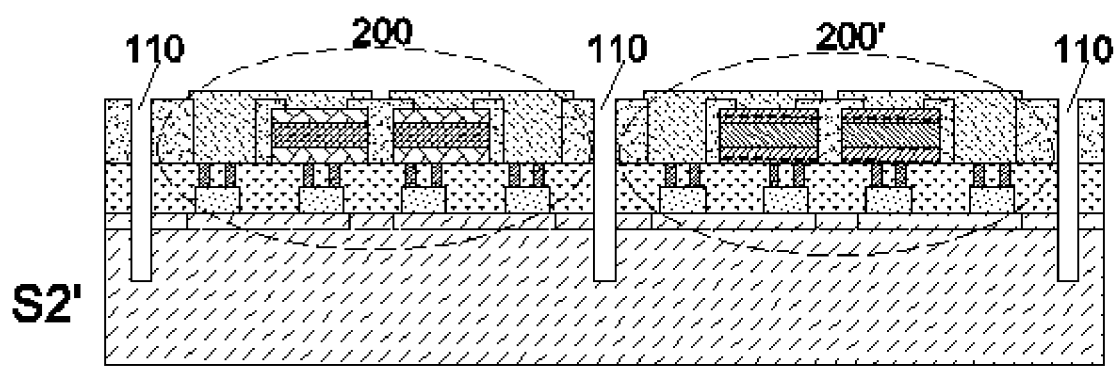
Fig. 6.2

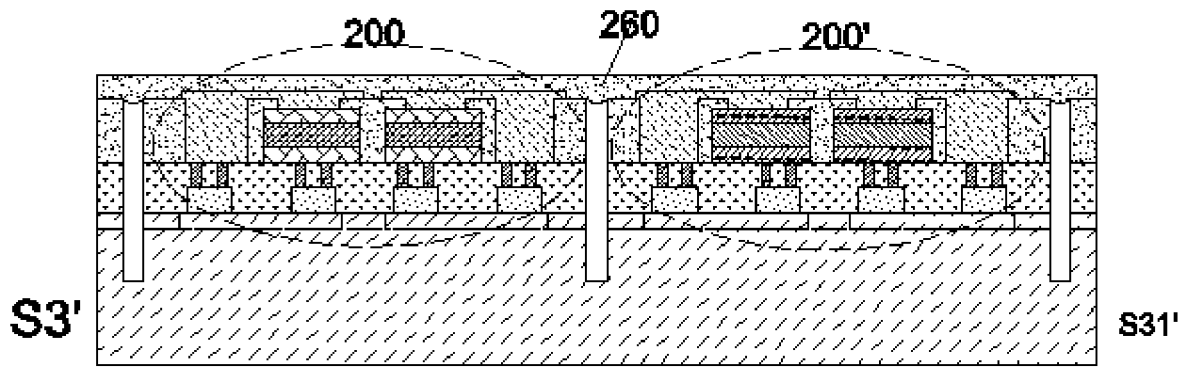
Fig. 6.3a
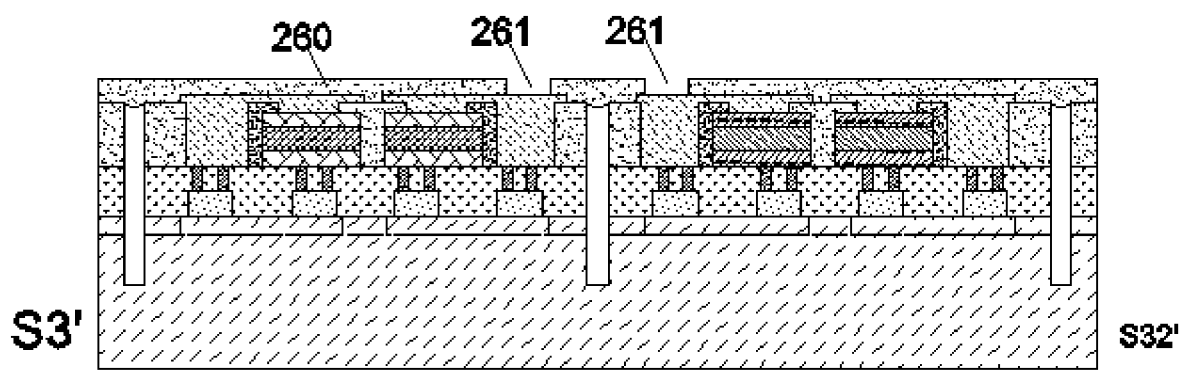
Fig. 6.3b
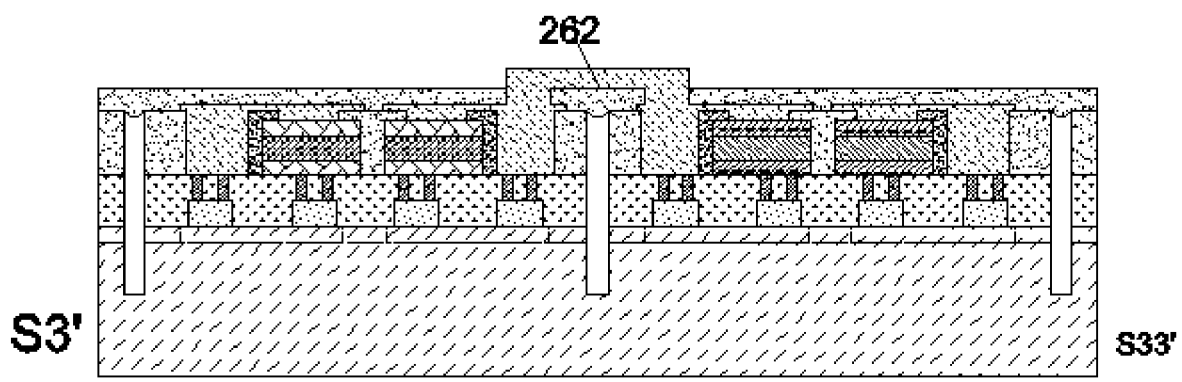
Fig. 6.3c

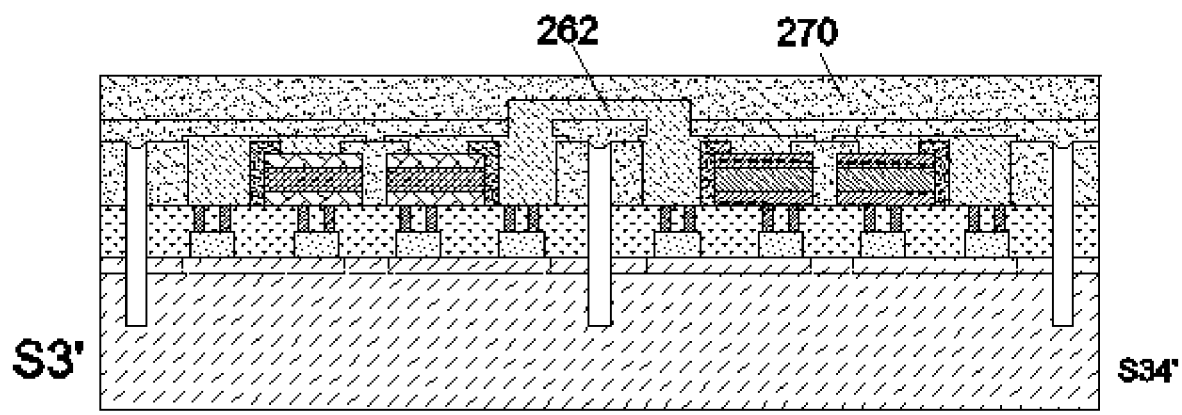
Fig. 6.3d
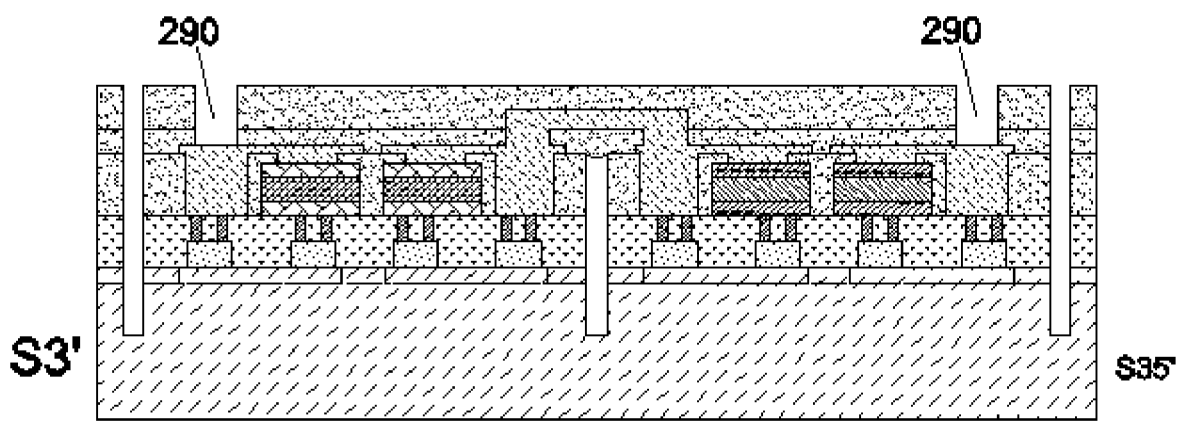
Fig. 6.3e
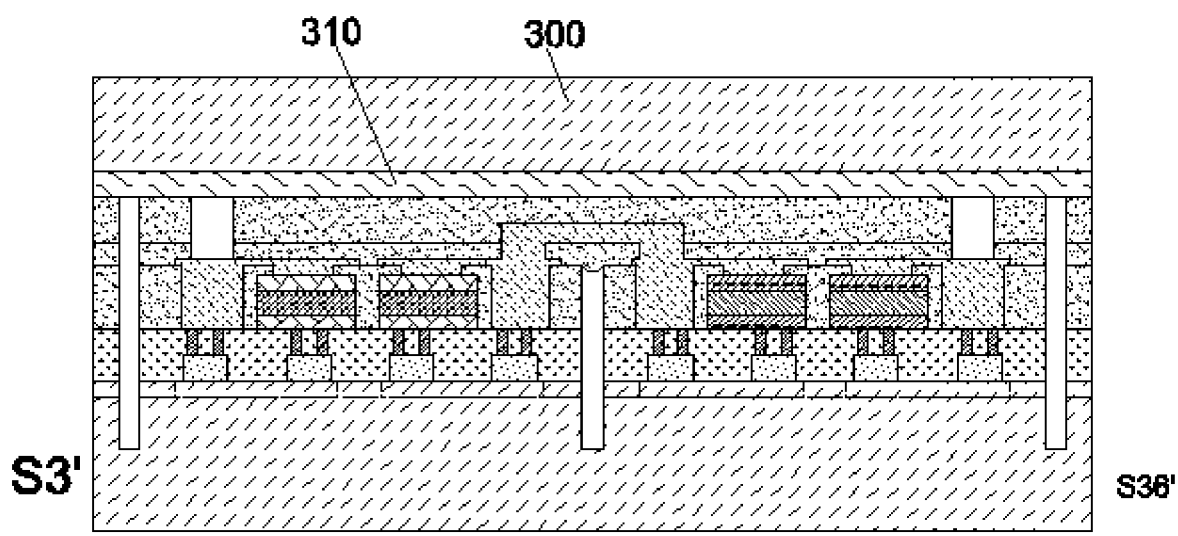
Fig. 6.3f

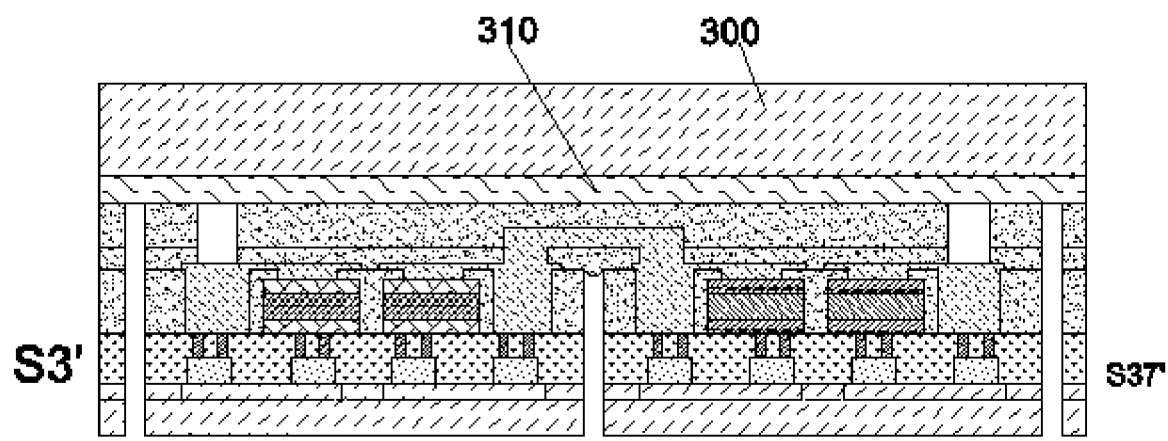
Fig. 6.3g

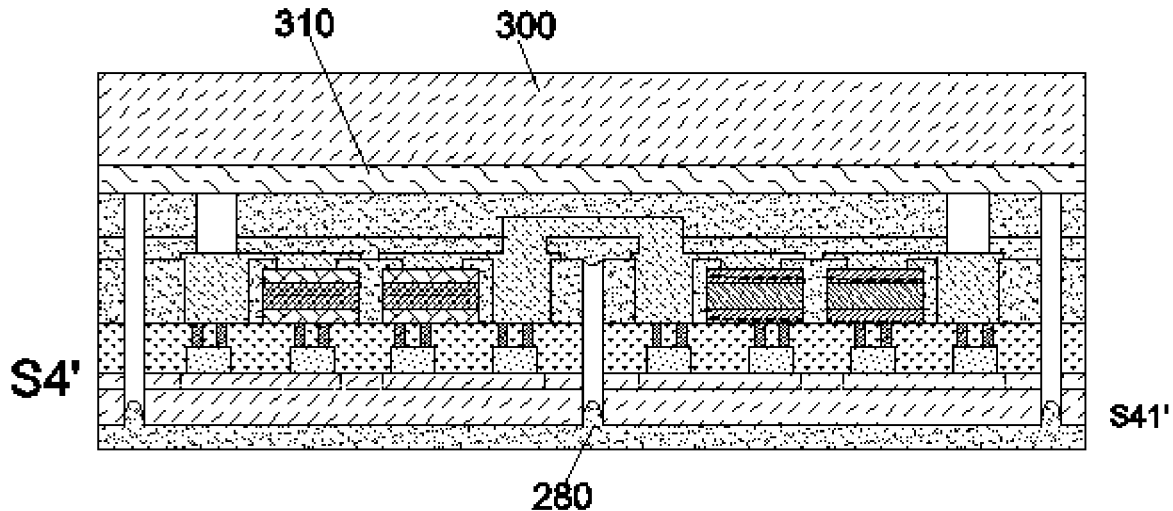
Fig. 6.4a
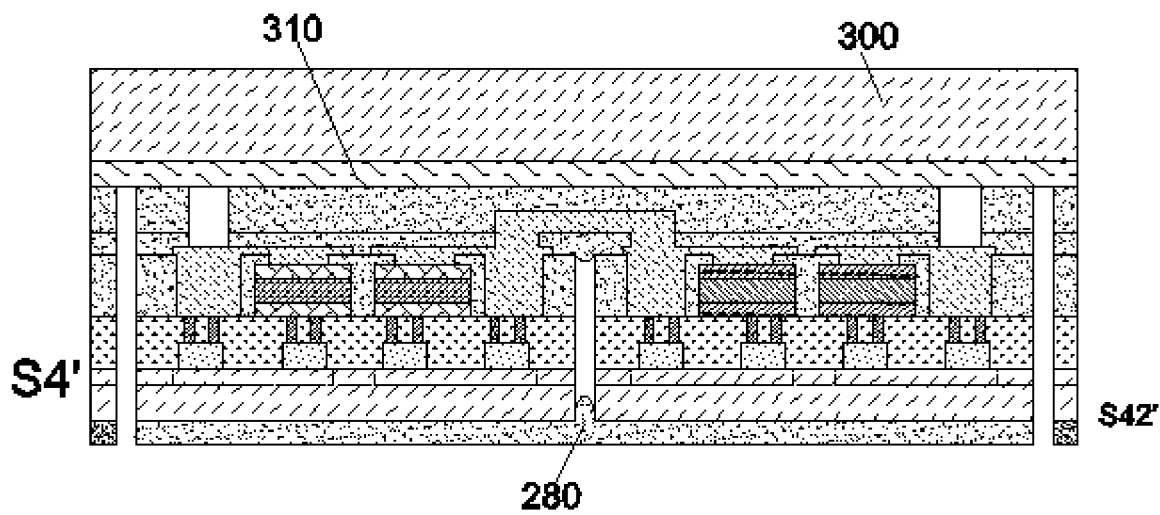
Fig. 6.4b
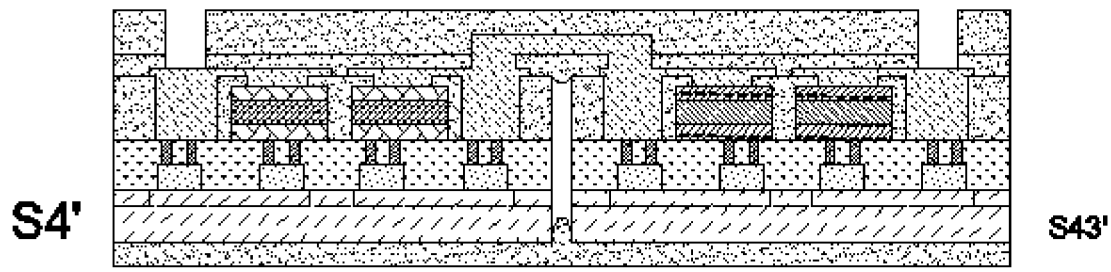
Fig. 6.4c

WAFER-LEVEL MANUFACTURING PROCESS OF A FLEXIBLE INTEGRATED ARRAY SENSOR

CROSS REFERENCE TO RELATED APPLICATION

The present application claims the benefit of priority to Chinese Patent Application No. CN 2019112450562, entitled "Flexible Integrated Array Sensor and Wafer-Level Manufacturing Process Thereof", filed with CNIPA on Dec. 6, 2019, the disclosure of which is incorporated herein by reference in its entirety.

FIELD OF TECHNOLOGY

The present disclosure generally relates to electronic devices, in particular to flexible sensors and their manufacturing processes.

BACKGROUND

Flexible sensors are widely used in the fields of human-computer interaction, robotic electronic skin, biomedicine, and health care. Flexible sensors' sensor units can measure pressure and temperature, and sense air flow and different types of gas. They can also be classified as piezoresistive, capacitive, and piezoelectric, etc., according to their sensing mechanism. For example, a piezoelectric flexible sensor utilizes piezoelectric effect of certain sensitive material: when an external force acts on the sensitive material, the sensitive material deforms which causes positive and negative bound charges to gather on its surface, and thereby generates electronic signals in response to external pressure.

For many types of flexible sensors, regardless of sensing mechanisms and elements to be detected, the information gathered by a sensing unit needs to be processed by a readout circuit and sent to a back-end circuit system for analysis. In order for the sensor to receive external signals coming from a large area and to enable the back-end system to detect complex external information, the sensor usually adopts an array (or dot matrix) comprised of several sensing units, and each sensing unit is equipped with a corresponding readout circuit to respond to external signals acting on it. This means that the sensing unit and the readout circuit are needed in the sensor array, and they will increase in number with the increase of the size of the array, which is problematic in light of the current status of the field of flexible array sensors.

On the one hand, organic thin film transistors are widely used in the field of flexible electronics due to their flexibility, low cost, and simple process, and therefore most readout circuits in sensors are made of organic thin film transistors. However, the carrier mobility of organic materials is low, resulting in a low sampling frequency, which hinders high-frequency signal detection. On the other hand, in most of the flexible array sensors currently reported, their internal sensing unit and readout circuit are separated. Most sensing units are electrically connected with a readout circuit through leads. As the size of the array increases the number of leads required increases, resulting in a complex circuit structure, which will cause a lot of noise and crosstalk and is not conducive to improving the spatial resolution of the sensors.

Besides, in the manufacturing process of flexible sensors, the mainstream method is to directly print organic or amorphous materials on a flexible substrate, which can be easily scaled and reduces manufacturing cost. However, compared with traditional silicon-based materials, organic or amorphous materials have lower carrier mobility, which restricts the operating frequency and performance of the device. Moreover, although traditional silicon-based materials have high carrier mobility and offer better sampling frequency and operating speed, it is still difficult to use silicon-based materials to make a highly integrated, highly sensitive flexible array sensor that integrates a readout circuit and sensing units. It is because it is difficult to thin rigid and brittle silicon materials to required thickness and make them flexible while their shapes remain intact. Also, thinned silicon slices are prone to damaging other parts of a device, thereby greatly reducing the yield and increasing the manufacturing cost.

SUMMARY

In various embodiments, a flexible integrated array sensor is provided, which includes a readout circuit layer disposed on a silicon wafer suitable for a flexible application, and a sensing array layer stacked on the readout circuit layer. The readout circuit layer includes a plurality of readout circuit units. The sensing array layer includes a plurality of sensing units, each of which is connected with one of the plurality of readout circuit units through a conductive tungsten plug to form a function unit. The function units are distributed in an m*n array on the silicon wafer to form a function array.

More specifically, in one embodiment, the disclosed concepts provide a flexible integrated array sensor containing a polymer substrate layer. The polymer substrate layer may include a top polymer substrate covering the function array. Alternatively, the polymer substrate layer may also include a bottom polymer substrate covering the side of the silicon wafer away from the function array.

The present disclosure further provides a method for manufacturing a flexible integrated array sensor is provided, which includes: preparing a silicon wafer; fabricating a plurality of function arrays on a surface of the silicon wafer through a semiconductor process; etching one or more deep grooves on the surface of the silicon wafer in areas between the function arrays to separate the function arrays from each other; fabricating a top polymer substrate layer above each function array and patterning, fabricating a thinning support on the patterned top polymer substrate layer; thinning a bottom surface of the silicon wafer to a target thickness to separate the function arrays on the silicon wafer from each other; and removing the thinning support and releasing the flexible integrated array sensor.

BRIEF DESCRIPTION OF THE DRAWINGS

FIGS. 3.1a-3.4c illustrate cross-sectional views of a flexible integrated array sensor with a function array having a single-function at various manufacturing operations according to certain embodiments.

FIGS. 6.1-6.4c illustrated cross-sectional views of a flexible integrated array sensor with a function array having multiple functions at various manufacturing operations according to certain embodiments.

DETAILED DESCRIPTION

Figure 1:
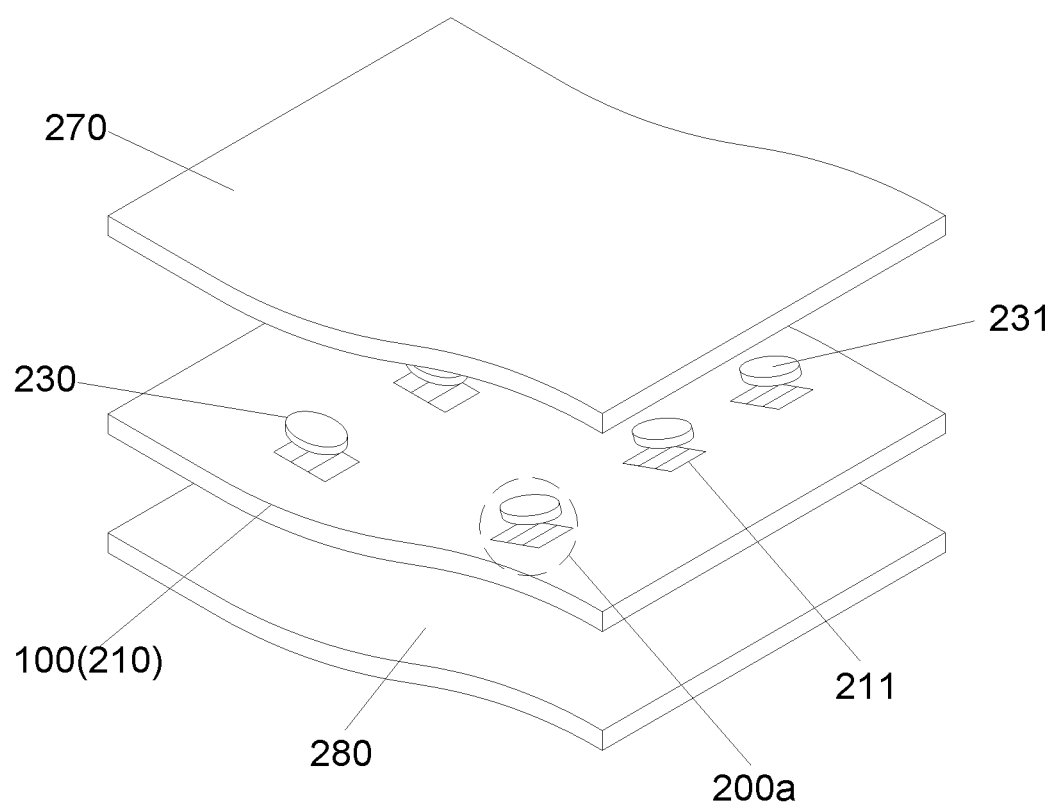
FIG. 1 is a perspective view of a flexible integrated array sensor with a function array having a single-function according to certain embodiments.

One or more specific embodiments of the present disclosure will be described below. These described embodiments are only examples of the presently disclosed techniques, and are not intended to limit aspects of the presently disclosed invention. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The disclosed sensor may be constructed based on a semiconductor fabrication process, which may be a multiple-step sequence of photographic and chemical-processing operations. During the fabrication process, different electronic components may gradually be created on a semiconductor wafer using various depositions and etching operations. The fabrication process may deposit a layer of material on top of other materials on, or etch/wash away material from, the semiconductor wafer. Throughout the disclosure, when a first layer of material (or "first layer") is deposited "above" or "on" a second layer of material (or "second layer"), the first layer may either be directly on the top of the second layer, or there might be additional material in between the first and the second layers. In other words, after the second layer of material is fabricated, additional material may be deposited on the top of the second layer before the first layer of material being deposited. Further, the term "top", "bottom", "above", "below", "up", or "down" may be relative to one surface of a horizontally-placed layer. Herein, a "groove", which may also be referred to as a "trench", may be a narrow or deep cut or depression on a surface of a layer.

The present disclosure generally relates to a flexible integrated array sensor. The flexible integrated array sensor functions without a complicated lead structure connecting its sensing units and readout circuit units. In one embodiment, there are micro-sensors functioning as sensing units of the array sensor, and the micro-sensors measure different objects by different mechanisms. One or more of the micro-sensors are manufactured by a semiconductor process. The sensing units' responses to external change are converted into charge, current or voltage change, which are received and responded to by corresponding readout circuits, and resulted electrical signal is then adjusted and sent to a back-end system to detect external information contained in the resulted electrical signal.

The present disclosure provides a flexible integrated array sensor with a function array. A micro pressure sensor with a piezoelectric measurement mechanism as the sensing unit in the function array is taken as an example to illustrate the idea provided by the present disclosure.

FIG. 1 is a perspective view of a flexible integrated array sensor with a function array having a single-function according to one embodiment. As shown in FIG. 1, the present disclosure provides a flexible integrated array sensor, which includes, among other things, a readout circuit layer 210, a piezoelectric sensing array layer 230, a top polymer substrate layer 270, and a bottom polymer substrate layer 280. The readout circuit layer 210 is disposed on a silicon wafer 100 suitable for flexible applications, and includes a plurality of readout circuit units 211. The piezoelectric sensing array layer 230 is disposed on the readout circuit layer 210 and includes a plurality of piezoelectric sensing units 231. For illustrative purpose, only the piezoelectric sensing units 231 of the piezoelectric sensing array layer 230 are shown in FIG. 1. Each of the plurality of sensing units 231 is connected with one of the plurality of readout circuit units 211 to form a corresponding function unit 200a. Multiple function units 200a are distributed in an m*n array on the silicon wafer 100 to form a function array 200. In one embodiment, as shown in FIG. 1, the function units 200a are distributed in a 3*2 array forming the function array 200.

In some embodiments, the sensing units 200a in the function array 200 have a spatial resolution of less than 1 mm.

In some embodiments, the readout circuit units 211 in the readout circuit layer 210 are micro integrated circuits, such as CMOS circuits, bipolar circuits, and thin film transistor circuits. In one embodiment, the manufacturing process of the readout circuits units 211 includes deposition, etching, photolithography, and ion implantation on a silicon wafer.

In some embodiments, the readout circuit units 211 receive signals, and modify signals. In one embodiment, a readout circuit unit 211 may respond to a pressure signal from a piezoelectric sensing unit 231, and convert the pressure signal into a voltage signal (or current signal), which is in turn recognized and received by a back-end system.

In some embodiments, silicon wafers suitable for flexible applications are thinner than 100 μm.

In operation, each of the plurality of readout circuit units 211 is connected with one of the plurality of piezoelectric sensing units 230 to form a corresponding function unit in the function array 200. When one or several sensing units in the piezoelectric sensing array layer 230 detect pressure asserted on it, they generate positive and negative induced charges, which are measured by one or more of the plurality of readout circuit units 211. Afterward, the plurality of readout circuit units 211 generate signals to be sent to a back-end system for processing. In some embodiments, each of the readout circuit units 211 and a corresponding sensing unit are integrated in one function unit, which can be prepared by semiconductor manufacturing techniques. In some embodiments, such integration reduces the number of leads, thereby reducing circuit complexity caused by traditional lead connection methods. In some embodiments, such integration also mitigates the problems of low sampling frequency and weak detection ability of high-frequency signals in traditional organic readout circuits, because the integration adopts silicon-based materials, which have high carrier mobility.

Figure 2:
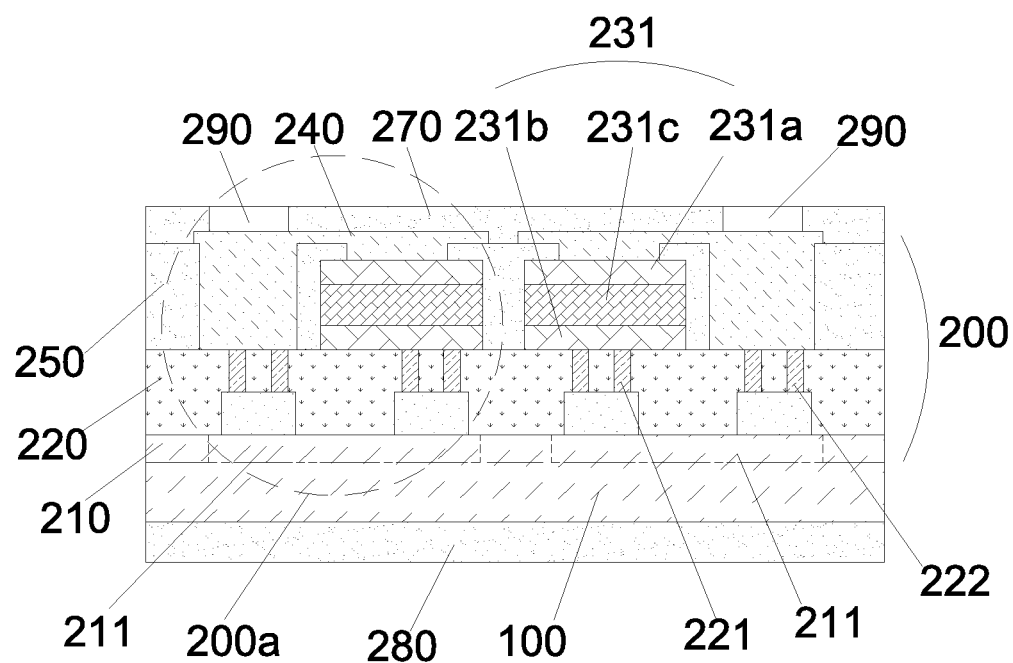
FIG. 2 is a cross-sectional view of a function unit of a flexible integrated array sensor.

Turning to FIG. 2, a cross-sectional view of a function unit of a flexible integrated array sensor is shown. The flexible integrated array sensor includes, among other things, a silicon wafer 100, a function array 200 including a plurality of function units 200a, a readout circuit layer 210 including a plurality of readout circuit units 211, a dielectric layer 220, conductive tungsten plugs 221, 222, piezoelectric sensing unit 231, a first connecting metal 240, polymer 250, a top polymer substrate layer 270, a bottom polymer substrate layer, and a pad 290.

Each of the plurality of readout circuit units 211 in the dielectric layer 220 is connected with two sets of conductive tungsten plugs 221, 222. Each piezoelectric sensing unit 231 includes a top electrode layer 231a, a piezoelectric material layer 231c, and a bottom electrode layer 231b, with the piezoelectric material layer 231c located between the top electrode layer 231a and the bottom electrode layer 231b. The bottom electrode layer 231b of each sensing unit is directly connected with a first wiring part of one corresponding readout circuit unit 211 through a first set of conductive tungsten plugs 221. The top electrode layer 231a of each sensing unit is indirectly connected with a second wiring part of the corresponding readout circuit unit 211 through a second set of conductive tungsten plugs 222 and first connecting metal 240, as shown in FIG. 2. As a result, each piezoelectric sensing unit 231 is connected with one of the readout circuit units 211, and the plurality of function units 200a further form the function array 200 as an m*n array on the silicon wafer 100.

In some embodiments, the material of the top electrode layer 231a and the bottom electrode layer 231b is molybdenum, titanium, aluminum, copper, tantalum, or gold. In some embodiments, the top electrode layer 231a and the bottom electrode layer 231b are made of the same material. In some embodiments, the top electrode layer 231a and the bottom electrode layer 231b are made of different materials.

In some embodiments, the entire sensing array is made of the same material as the piezoelectric material layer 231c. In some embodiments, the piezoelectric material layer 231c is a piezoelectric thin film made of materials such as lead zirconate titanate, aluminum nitride, scandium-doped aluminum nitride, and zinc oxide. When an external pressure acts on the piezoelectric material layer 231c, positive and negative charges of equal amount are generated on the top electrode layer 231a and the bottom electrode layer 231b respectively. The positive and negative charges are measured by the corresponding readout circuit unit 211 through the conductive tungsten plugs 221, 222 connected with one of the readout circuit units 211.

In some embodiments, a method for manufacturing the conductive tungsten plugs 221, 222 includes, but not limited to, fabricating a dielectric layer 220 on the readout circuit layer 210, and disposing several conductive tungsten plugs 221, 222 connected with the readout circuit units 211 in the dielectric layer 220. In some embodiments, the dielectric layer 220 is made of materials such as silicon dioxide, silicon nitride, and silicon oxynitride.

In some embodiments, the flexible integrated array sensor includes one or more polymer substrate layers, as shown in FIG. 2. In some embodiments, the flexible array sensor only includes a top polymer substrate layer 270 covering the function array 200. In some embodiments, the flexible array sensor includes a bottom polymer substrate layer 280 covering a side of the silicon wafer away from the function array 200. In some embodiments, the flexible array sensor includes both the top polymer substrate layer 270 and the bottom polymer substrate layer 280. In some embodiments, the polymer substrate layers are disposed on corresponding layers through spin coating or deposition techniques. The polymer substrate layers are made of materials such as polyimide, polyester, polyurethane, ethylene-vinyl acetate copolymer, polyolefin, epoxy resin, polycarbonate, polyamide, acrylic resin, silicone resin, or parylene materials, or a combination of some of them. Some examples of the aforementioned parylene materials are Parylene C, Parylene D, Parylene F, Parylene N, and Parylene HT.

FIGS. 3.1a-3.4c illustrate cross-sectional views of a flexible integrated array sensor with a function array having a single-function at various manufacturing stages according to one embodiment. Generally, the manufacturing process illustrated in FIGS. 3.1a-3.4c is as follows:

S1. Preparing a silicon wafer 100, and fabricating a plurality of function arrays, each of which including m*n function units on a surface of the silicon wafer 100 through semiconductor manufacturing processes such as ion implantation, deposition, lithography, and etching. (referring to FIGS. 3.1a-3.1f); for each function array 200, S1 further includes:

S11. Fabricating a readout circuit layer 210 including a plurality of readout circuit units 211 on the surface of the silicon wafer 100 (referring to FIG. 3.1a), and constructing conductive tungsten plugs 221, 222 connected with the readout circuit units 211 (referring to FIG. 3.1b); and S12. Fabricating piezoelectric sensing units 231 on the readout circuit layer 210, and forming a piezoelectric sensing array layer containing m*n piezoelectric sensing units 231 through lithography, and directly coupling each electrode of one of the readout circuit units to a corresponding readout circuit unit 211 or indirectly coupling each electrode of one of the readout circuit units with a corresponding readout circuit unit 211 through conductive tungsten plugs 221, 222 and a piece of connecting metal 240 to form a function array 200 (referring to FIG. 3.1c-FIG. 3.1f);

S2. Etching one or more deep grooves 110 on the surface of the silicon wafer 100 in areas between the function arrays 200 to separate the function arrays 200 from each other, with each of the one or more deep grooves 110 located between two of the function arrays 200, with the etching depth equal to or greater than the thickness of the silicon wafer 100 when it is subsequently thinned at S3 (referring to FIG. 3.2);

S3. Fabricating a top polymer substrate layer 270 above each function array 200, (referring to FIG. 3.3a), lithographing the top polymer substrate layer 270 (referring to FIG. 3.3b), fabricating a thinning support on the top polymer substrate layer 270 after lithographing (referring to FIG. 3.3c), and thinning a bottom surface of the silicon wafer 100 to a target thickness so that the function arrays 200 on the silicon wafer are separated from each other (referring to FIG. 3.3d), with the bottom surface of the silicon wafer 100 being a surface of the silicon wafer 100 away from the function array 200; and S4. Spin-coating or depositing a bottom polymer substrate layer 280 on the bottom surface of the silicon wafer 100 after thinning (referring to FIG. 3.4a), lithographing the bottom polymer substrate layer 280 to make it match the top polymer substrate layer 270 (referring to FIG. 3.4b), and then removing the thinning support and releasing the flexible integrated array sensor (referring to FIG. 3.4c).

Further disclosure of operation S1: "constructing conductive tungsten plugs 221, 222 connected with the readout circuit units 211" at S11 means that the dielectric layer 220 is fabricated on the readout circuit layer, and two sets of conductive tungsten plugs 221, 222 are connected with two wiring parts of the readout circuit units 211 on the dielectric layer 220 (referring to FIG. 3.1b). In some embodiments, S12 includes: sequentially fabricating the bottom electrode layer 231b, the piezoelectric material layer 231c, and the top electrode layer 231a on the dielectric layer 220 (referring to FIG. 3.1c); lithographing the electrode layers to form the piezoelectric sensing array layer 230 including m*n separated piezoelectric sensing units 231, directly connecting each bottom electrode layer 231b with the first wiring part of a corresponding readout circuit unit 211 through the conductive tungsten plug 221 (referring to FIG. 3.1d); and placing the first connecting metal 240 between the top electrode layer 231a and one of the conductive tungsten plugs 222 so that each top electrode layer 231a is connected with the second wiring part of one of the readout circuit units 211, thereby forming a function array including m*n function units (referring to FIG. 31f).

As for fabricating the first connecting metal 240, in some embodiments, a layer of polymer 250 is first deposited on the piezoelectric sensing array layer 230 (referring to FIG. 3.1e), where the polymer 250 has first contact holes 251 between each top electrode layer 231a of the piezoelectric sensing units 231 and the corresponding conductive tungsten plug 222 of the top electrode layer 231a, and then the first connecting metal 240 is placed where the first contact holes are, with the first connecting metal 240 connecting the top electrode layer 231a and the corresponding conductive tungsten plug 222.

Further disclosure of operation S2: in some embodiments, the ion beam etching technique is used for etching the one or more deep grooves 110; in some embodiments, the reactive ion etching technique is used for etching the one or more deep grooves 110. The plurality of function arrays 200 are simultaneously prepared on the silicon wafer 100 by semiconductor manufacturing techniques, and the deep groove etching of the silicon wafer 100 between the function arrays 200 causes the function arrays 200 to separate from each other (referring to FIG. 3.2).

Further disclosure of operation S3: in some embodiments, the thinning support is fabricated on a surface of the top polymer substrate layer 270 by temporarily bonding another silicon wafer (hereinafter referred to as the support wafer 300) to the surface of the top polymer substrate layer 270 with bonding material 310 (referring to S33 in FIG. 3.3c). The thinning support serves to facilitate the thinning process, which is conducted on the bottom surface of the silicon wafer 100. Since the target thickness of the silicon wafer 100 is small, and the one or more deep grooves 110 are already etched and partially divide the arrays before the bottom surface is thinned, it is necessary to provide a rigid support for each array before thinning the bottom surface of the silicon wafer 100. Techniques used for thinning the bottom surface of silicon wafers include grinding, chemical mechanical polishing, wet etching, plasma etching, and dry polishing. Besides, the aforementioned "thinning support" operation may be replaced by pasting a blue film to the silicon water 100 in some embodiments. When a temporary bonding method is used for the support wafer 300, in some embodiments, the flexible integrated array sensor with a function array having a single-function is released by removing the thinned support after de-bonding.

Further disclosure of operations S3 and S4: lithographing of the polymer substrate layer in operation S3 and operation S4 removes polymer substrate covering one or more deep grooves in areas between function arrays (referring to FIG. 3.3b and FIG. 3.3c), so that the device can be smoothly released after thinning to obtain a flexible integrated array sensor with a function array having a single-function. The two lithographing processes occur where the deep groove etching occurs on the silicon wafer. It is worth noting that in some embodiments, the bottom polymer substrate layer 280 is omitted, and only the top polymer substrate layer 270 remains. In some embodiments, both the top polymer substrate layer 270 and the bottom polymer substrate layer 280 are fabricated, as shown in FIGS. 3.1a-3.4c. Besides, in some embodiments, when the top polymer substrate layer 270 is lithographed, a pad 290 for connecting the sensor and an external system is included (referring to FIG. 3.3c).

As mentioned above, in some embodiments, the plurality of function arrays 200, each of which including m*n function units 200a, are fabricated on the silicon wafer 100 (take a piezoelectric micro pressure sensor as an example, each function unit 200a includes a piezoelectric sensing unit 231 and a corresponding readout circuit unit 211), and then one or more deep grooves with a thickness equal to or slightly larger than the target thickness are etched between the function arrays 200. The advantages of one or more aspects of such operations in some embodiments are two-fold: first, the film stress generated in the thinning of the silicon wafer 100 is released by etching the one or more deep grooves, preventing the silicon wafer 100 from warping and cracking; second, there is no longer need to scribe the silicon wafer 100 after thinning, unlike traditional approaches, and therefore the silicon wafer 100 can be released without mechanical scribing, and damages caused by scribing are avoided. In some embodiments, the one or more deep grooves also help to isolate defects propagation during the thinning process. Techniques like this make silicon-based materials more promising as a candidate for flexible integrated sensing. In some embodiments, the target thickness of the thinned silicon wafer is less than 100 μm. Silicon wafers with a thickness less than 100 μm have higher flexibility, which increases the feasibility of preparing flexible integrated sensor arrays.

In some embodiments, the flexible array sensor with a function array having a single-function is manufactured by stacking a piezoelectric sensing unit 231 and a readout circuit unit 211 inside the device. Such arrangement not only improves the integration level, but also mitigates many problems caused by too many leads for researchers, such as complex circuit structures, noise, and interference, thereby making integrated piezoelectric array sensors possible.

Figure 4:
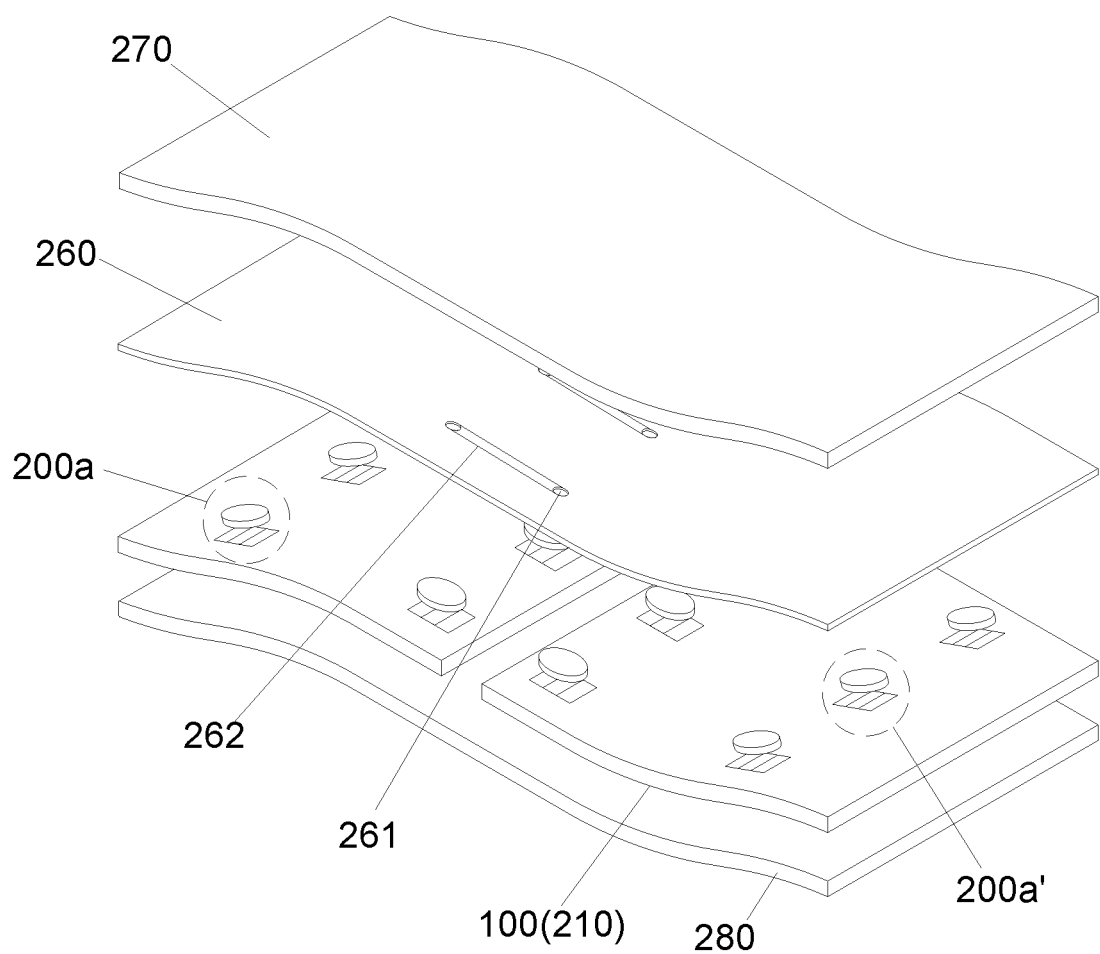
FIG. 4 is a perspective view of a flexible integrated array sensor with a function array having multiple functions according to certain embodiments.
Figure 5:
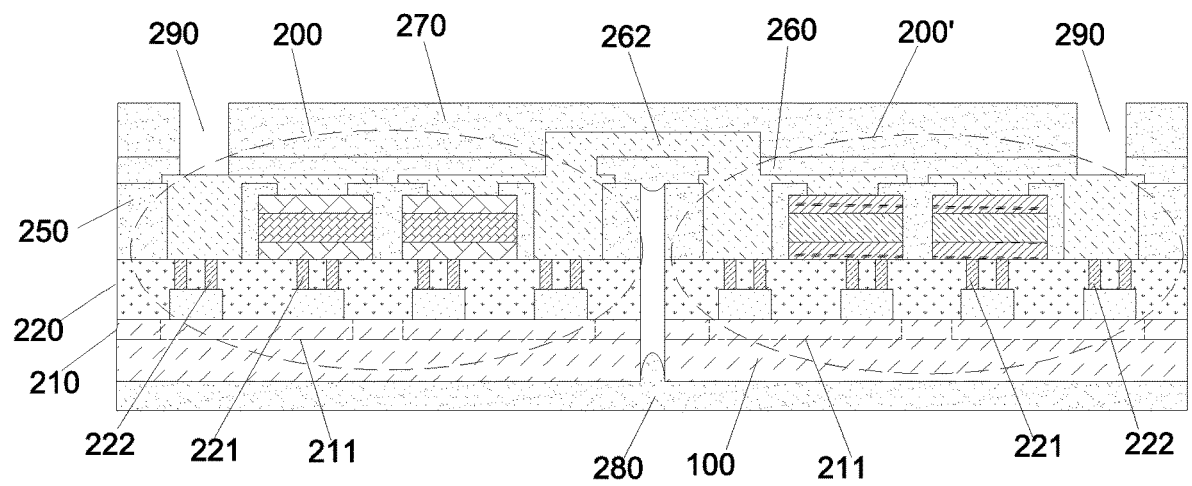
FIG. 5 is a cross-sectional view of a function unit of a flexible integrated array sensor.

Turning to FIGS. 4-5, the present disclosure also provides a flexible integrated array sensor with two different function arrays 200, 200'. One difference between the embodiments illustrated by FIGS. 4-5 and the embodiments illustrated by FIG. 1-3 is that the flexible integrated array sensors illustrated by FIGS. 4-5 have at least two functions, which, in some embodiments, is achieved when the sensing array layers in the two function arrays consist of micro sensors with different sensing mechanisms and/or different performances. In some embodiments, as shown in FIGS. 4-5, the left function array 200 includes one or more function units 200a, the right function array 200' includes one or more function units 200a', and the two are made of different sensing units. Those skilled in the art should be enabled by the disclosure herein to make, without undue experimentation, a flexible array sensor with more than two different function arrays.

FIGS. 4-5 show a flexible integrated array sensor with two different function arrays 200, 200'. Another difference between the embodiments illustrated by FIGS. 4-5 and the embodiments illustrated by FIGS. 1, 2, 3.1a-3.4c, is that the flexible integrated array sensors illustrated by FIGS. 4-5 have a polymer passivation layer 260 disposed between the top polymer substrate 270 and the function array 200. The polymer passivation layer 260 includes several second contact holes 261 (referring to FIG. 6.3b), and two (or more than two) separate function arrays are electrically connected through the second contact holes 261 and a piece of second connecting metal 262. Compared to the embodiments illustrated by FIGS. 1, 2, 3.1a-3.4c, the embodiments illustrated by FIGS. 4-5 adds a polymer passivation layer 260, and uses the second contact holes 261 on the polymer passivation layer 260 to electrically connect two separate function arrays through the second connecting metal 262. The polymer passivation layer 260 is made of materials such as polyimide, polyester, polyurethane, ethylene-vinyl acetate copolymer, polyolefin, epoxy resin, polycarbonate, polyamide, acrylic resin, silicone resin, parylene materials, and combinations thereof.

In terms of manufacturing processes, one difference between the embodiments illustrated by FIGS. 1, 2, 3.1a-3.4c and the embodiments illustrated by FIGS. 4-5 lies in the operation S3'. Referring to FIG. 6.3a-FIG. 6.3g, at S3', before fabricating the top polymer substrate layer 270, the method includes: preparing a polymer passivation layer 260 on the function arrays 200 (referring to FIG. 6.3a), preparing the second contact holes 261 on the polymer passivation layer 260 (referring to FIG. 6.3b), electrically connecting the two separate function arrays 200 through the second connecting metal 262 by using the second contact holes 261 (referring to FIG. 6.3c); preparing a top polymer substrate layer 270 on the polymer passivation layer 260 (referring to FIG. 6.3d), and lithographing the polymer passivation layer 260 and the top polymer substrate layer 270 (referring to S35' in FIG. 6.3e). As illustrated by S35' in FIG. 6.3e, when the polymer passivation layer 260 and the top polymer substrate layer 270 are lithographed, a pad 290 for connecting the sensor to an external system is also included.

One of the purposes of lithographing the polymer passivation layer 260 and the top polymer substrate layer 270 together is to remove the parts of the two layers covering the one or more deep grooves in order to smoothly release the device after thinning and obtain a flexible integrated array sensor with two different function arrays. Those skilled in the art should be able to decide on the specific lithographing position, according to the number and distribution of function arrays required during implementation. FIGS. 4-5 of the present disclosure show schematic views of a flexible array sensor with two different function arrays 200, 200' as an example.

Still referring to FIGS. 6.3a-FIG. 6.3g, after the polymer passivation layer 260 and the top polymer substrate layer 270 are lithographed and the pad 290 is fabricated, subsequent processes regarding thinning support and thinning of the bottom surface of the wafer 100 are similar to those illustrated by FIG. 3.3c-FIG. 3.3d, referring to S36' in FIG. 6.3f and S37' in FIG. 6.3g, and those skilled in the art should be able to implement S36', S37' without undue experimentation.

After the thinning at S3' is completed, the manufacturing processes, in some embodiments, further include S4': spin-coating or depositing a bottom polymer substrate layer 280 (referring to FIG. 6.4a) on the bottom surface of the silicon wafer 100, and lithographing the bottom polymer substrate layer 280 to make the bottom polymer substrate layer 280 match the top polymer substrate layer 270 (referring to FIG. 6.4b), removing the thinning support fabricated at S36' (referring to FIG. 6.4c) and releasing the fabricated flexible integrated array sensor with function arrays having dual or multiple functions.

In some embodiments, the flexible array sensor has two or more different function arrays, and those skilled in the art should be able to modify the processes illustrated by S1' based on the present disclosure, to manufacture such flexible array sensor with two or more different function arrays. The present disclosure presents FIGS. 4-6.4c only as examples.

The above description of illustrated implementations of the present disclosure is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

LIST OF REFERENCE NUMERALS

100 Silicon wafer
110 Deep groove
200 Function array
200a Function unit
300 Support wafer
310 Bonding material
210 Readout circuit layer
211 Readout circuit unit
220 Dielectric layer
221, 222 Conductive tungsten plugs
230 Piezoelectric sensing array layer
231 Piezoelectric sensing unit
231a Top electrode layer
231b Bottom electrode layer
231c Piezoelectric material layer
240 First connecting metal
250 Polymer
251 First contact hole
260 Polymer passivation layer
261 Second contact hole
262 Second connecting metal
270 Top polymer substrate layer
280 Bottom polymer substrate layer
290 Pad

We claim:

1. A method of manufacturing a wafer-level flexible integrated array sensor, the method comprising:
   fabricating function arrays on a surface of a silicon wafer by
      forming a readout circuit layer with readout circuit units disposed on the silicon wafer,
      forming a sensing array layer with sensing units stacked on the readout circuit layer,
      forming function units by electronically connecting a corresponding sensing unit and a corresponding readout circuit unit, and
      forming the function arrays by distributing the function units in m*n arrays on the silicon wafer, wherein each of the function arrays include one m*n array of function units;
   etching one or more grooves on a surface of the silicon wafer between the function arrays to isolate defect-propagation during a thinning process and separate the function arrays from each other, wherein an etching depth of each of the grooves is equal to or greater than a target thickness of the silicon wafer after subsequent thinning;
   fabricating a top polymer substrate layer above each of the function arrays;
   patterning the top polymer substrate layer;
   fabricating a thinning support above the function arrays;
   performing the thinning process by thinning a bottom surface of the silicon wafer to the target thickness, wherein the bottom surface of the silicon wafer is a surface of the silicon wafer away from the function array;

spin-coating or depositing a bottom polymer substrate layer on the bottom surface of the thinned silicon wafer;

patterning the bottom polymer substrate layer to make patterns of the bottom polymer substrate layer and the top polymer substrate layer match each other; and removing the thinning support to separate the function arrays into a plurality of flexible integrated array sensors, wherein two neighboring array sensors of the plurality of flexible integrated array sensors are separated by one of the grooves.

2. The method of manufacturing the wafer-level flexible integrated array sensor according to claim 1, wherein the fabricating function arrays on the surface of the silicon wafer further comprises:

constructing conductive tungsten plugs coupled with the readout circuit units; and directly connecting each electrode of the sensing units to a corresponding readout circuit unit or indirectly connecting each electrode of the sensing units with the corresponding readout circuit unit through a conductive tungsten plug and connecting metal to form the function array.

3. The method of manufacturing the wafer-level flexible integrated array sensor according to claim 1, wherein the method used to etch the groove is one of ion beam etching and reactive ion etching.

4. The method of manufacturing the wafer-level flexible integrated array sensor according to claim 1, wherein before fabricating the thinning support, the method further comprises:

preparing a polymer passivation layer on the function arrays and preparing a contact hole on the polymer passivation layer;

connecting at least two separate function arrays electrically through connecting metal and the contact hole;

preparing the top polymer substrate layer on the polymer passivation layer; and patterning the polymer passivation layer and the top polymer substrate layer.

* * * * *